United States Patent
Woolsey et al.

(10) Patent No.: US 7,390,975 B2
(45) Date of Patent: Jun. 24, 2008

(54) SELF-ALIGNING ELECTROMAGNETIC INTERFERENCE GASKETS FOR CUSTOMER REMOVABLE MODULES

(75) Inventors: Terrill Woolsey, Wichita, KS (US); Robert Harvey, Wichita, KS (US)

(73) Assignee: LSI Corporation, Milpitas, CA (US)

( * ) Notice: Subject to any disclaimer, the term of this patent is extended or adjusted under 35 U.S.C. 154(b) by 124 days.

(21) Appl. No.: 11/493,260

(22) Filed: Jul. 25, 2006

(65) Prior Publication Data

US 2008/0023222 A1    Jan. 31, 2008

(51) Int. Cl.
*H05K 9/00* (2006.01)
(52) U.S. Cl. .................... 174/355; 174/369; 174/382; 361/799; 361/800
(58) Field of Classification Search ............ 174/355, 174/369, 382; 361/816, 818, 800, 799
See application file for complete search history.

(56) References Cited

U.S. PATENT DOCUMENTS

| | | | | |
|---|---|---|---|---|
| 5,654,873 A * | 8/1997 | Smithson et al. | ............ | 361/685 |
| 5,721,669 A * | 2/1998 | Becker et al. | ............ | 361/685 |
| 6,043,991 A * | 3/2000 | Sorrentino | ............ | 361/816 |
| 6,048,642 A | 4/2000 | Woolsey | ............ | 429/163 |
| 6,198,040 B1 * | 3/2001 | Desousa et al. | ............ | 174/375 |
| 6,281,433 B1 * | 8/2001 | Decker et al. | ............ | 174/394 |
| 6,291,766 B1 * | 9/2001 | Komai | ............ | 174/377 |
| 6,320,120 B1 * | 11/2001 | Van Haaster | ............ | 174/369 |
| 6,449,171 B1 * | 9/2002 | Karnes | ............ | 361/796 |
| 6,483,024 B1 * | 11/2002 | Smithson et al. | ............ | 174/354 |
| 6,600,660 B2 * | 7/2003 | Hattori | ............ | 361/801 |
| 6,730,842 B2 | 5/2004 | Woolsey | ............ | 174/50 |
| 6,794,571 B1 * | 9/2004 | Barringer et al. | ............ | 174/359 |
| 6,865,092 B2 * | 3/2005 | Joist et al. | ............ | 361/818 |
| 7,042,737 B1 | 5/2006 | Woolsey et al. | ............ | 361/799 |
| 2002/0012237 A1 * | 1/2002 | Dimarco | ............ | 361/796 |

* cited by examiner

*Primary Examiner*—Hung V Ngo
(74) *Attorney, Agent, or Firm*—Kermit D. Lopez; Luis M. Ortiz; Ortiz & Lopez, PLLC

(57) ABSTRACT

An electromagnetic interference (EMI) gasket for an electronic module comprises a valley feature formed on one side of an EMI gasket and a crown feature formed on the other side of the EMI gasket in order to complement the valley. One or more EMI gaskets are used to construct a shield across the opening of a module cage or rack. Each gasket forms a link in a series of modules, in order to complete a seal across the opening in the cage. A perpendicular pressure forces the module gaskets to center and align evenly as the crown and valley of the opposite features nest together. The modules can be then pressed together and the overlap of the crown and valley acts to center the alignment and create a pressure for satisfactory EMI grounding and the reduction of EMI leakage.

20 Claims, 9 Drawing Sheets

SELF-ALIGNING ELECTROMAGNETIC INTERFERENCE GASKETS FOR CUSTOMER REMOVABLE MODULES

TECHNICAL FIELD

Embodiments are generally related to data-processing devices. Embodiments are also related to removable computer hardware components. Embodiments are additionally related to devices and components for preventing EMI (Electromagnetic Interference) in computer components and systems.

BACKGROUND OF THE INVENTION

Electromagnetic Interference (EMI) involves the introduction of unacceptable amounts of electromagnetic energy into an environment due to the presence of electrical devices and equipment. For example, a desktop or a laptop computer chassis may include many micro-electronic components that perform various electrical-based tasks. In such devices, electromagnetic energy is typically radiated due to the electrical switching operations of the components. Accordingly, the radiated electromagnetic energy may significantly degrade the performance of other devices, if the radiated electromagnetic energy is permitted to be introduced into a common environment.

EMI is physically related to the transmission and reception of electromagnetic energy. The radiation of the electromagnetic energy to the receiver may cause the receiver to act in an undesired and often unpredictable manner. EMI shielding is often utilized to reduce or eliminate the effects of EMI. Such shielding involves the placement of an electromagnetic shield or EMI shield between an EMI source and potential EMI receivers. The electromagnetic shield may be provided in the form of a continuous metal sheet. The electromagnetic shield may adopt alternative forms such as a perforated metal sheet that permits thermal radiation. The electromagnetic energy emitted by a source propagates as an electromagnetic wave. The electromagnetic wave is partially absorbed by the EMI shield. Accordingly, the intensity of the electromagnetic wave can be attenuated or reduced and the EMI effects upon receivers are lessened.

The design of an electromagnetic shield significantly impacts its effectiveness in reducing the intensity of the electromagnetic wave associated with the EMI. For example, a gap or seam in an electromagnetic shield can result in EMI leakage. Another problem associated with sheet metal EMI shields is that such components cannot easily accommodate different separation tolerances and minimum compression requirements throughout the EMI shield. Accordingly, EMI gaskets are utilized to prevent gaps or seams from causing EMI leakage. EMI gaskets are conductive media designed to provide for a flexible connection between two electrical conductors used as EMI shields.

EMI gaskets can be selectively placed to reduce any slots, seams, or other discontinuities between the EMI shields to prevent EMI leakage. EMI gaskets are used to maintain shielding effectiveness by proper seam treatment. It is the effect of these seams and discontinuities, in general, which accounts for most of the leakages in an enclosure design. The shielding effectiveness of a seam is dependent upon the materials, contact pressure, and surface area. Deviation from the appropriate compression force may either allow EMI leakage or damage the EMI gasket.

In an effort to address the foregoing difficulties, a continuous metal to metal contact can be provided using a valley feature on one side of EMI gasket and a crown feature on the opposite side that complements the valley. It is believed that the implementation of such a method can reduce EMI leakage and maintain a good EMI grounding.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide for improved Electromagnetic Interference gaskets.

It is another aspect of the present invention to provide for a method to self align Electromagnetic Interference gasket for customer removable modules.

The aforementioned aspects and other objectives and advantages can now be achieved as described herein. An electromagnetic interference gasket for an electronic module is described, which includes a valley feature on one side of the EMI gasket and a crown feature on the other side in order to complement the valley. EMI gaskets are used to construct a shield across the opening of a module cage or rack. Each module gasket can function as a link in a series of modules, in order to complete a seal across the opening in the cage. A perpendicular pressure forces the module gasket(s) to center and align evenly as the crown and valley of the opposite features nest together.

The modules can be assembled side by side and the overlap of the crown and the valley centers the alignment in order to create pressures for enhanced EMI grounding, while reducing EMI leakage. EMI gaskets maintain conductive contact across mating surfaces, and the use of gaskets plays a significant role in preventing radiated fields from leaving an enclosure. The EMI gasket described herein possesses a unique compression and deflection curve, which defines the gasket's range of deflection and conforms to the irregularities of the two mating surfaces under an applied force.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

EMI (electromagnetic interference) is the disruption of operation of an electronic device when it is in the vicinity of an electromagnetic field (EM field) in the radio frequency (RF) spectrum that is caused by another electronic device. All electronic devices give off electromagnetic emissions or radiation that is a byproduct of electrical or magnetic activity. Unfortunately, the emissions from one device can interfere with other devices, causing potential problems. Interference can lead to data loss, picture quality degradation on monitors, and other problems with a PC, or problems with other devices such as television sets and radios. Such problems are generally categorized as electromagnetic interference or EMI, which can be eliminated by using EMI gaskets or seals. EMI gaskets maintain conductive contact across mating surfaces, and the use of gaskets plays a significant role in preventing radiated fields from leaving an enclosure.

Figure 1:
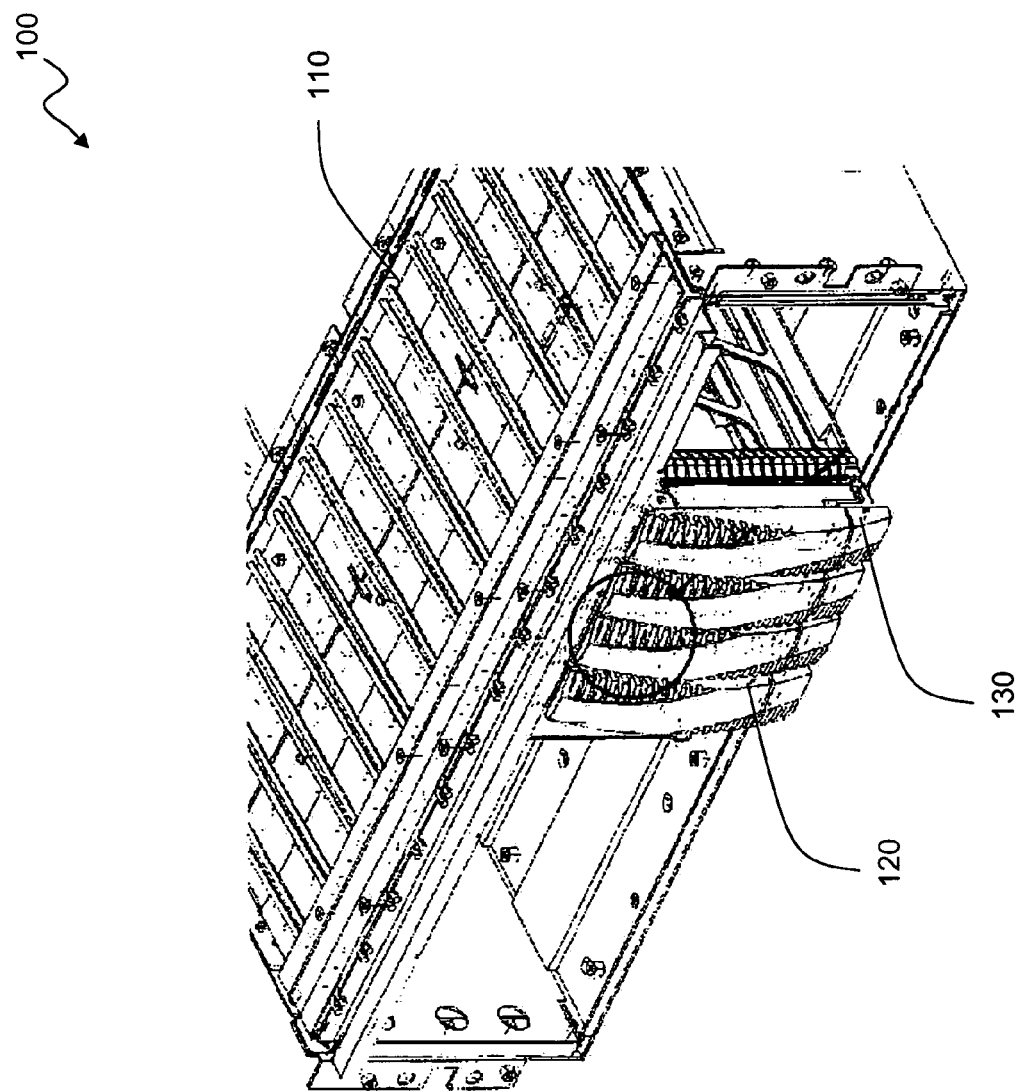
FIG. 1 illustrates a perspective view of a housing containing multiple modules shielded with EMI gaskets, in accordance with a preferred embodiment.

Referring to FIG. 1, a perspective view of a housing 100 containing multiple modules shielded with EMI gaskets is illustrated, in accordance with a preferred embodiment. As depicted in FIG. 1, a housing 110 can be engaged with multiple customer removable modules 130 that provide a connection between circuits on a circuit board and other electronic devices. Modules 130 can be used, for example, in the context of in data transmission servers and routers. Modules 130 may also include adapters that utilize a small circuit board for mating with a card edge connector mounted to the circuit board and held within the rear of the housing 110, or may include optical transceivers that permit the conversion of optical signals transmitted through fiber optic cables to electrical signals that are transmitted through circuits on the circuit board. The external cosmetic surfaces of modules 130 must be aligned evenly in order to prevent corrosion other than perforation, such as cosmetic or surface corrosion due to defects in materials or workmanship.

The modules 130 or adapters can be plugged into individual bays or receptacles mounted to the circuit board and which have an opening that communicates with the exterior of the device, preferably through a panel of the device. These metal cages are used to shield the modules 130 from external electromagnetic waves, as well as to contain electromagnetic waves emanating from the modules 130. Electromagnetic Interference (EMI) gasket 120 can be used to shield multiple modules 130 in order to prevent electromagnetic radiation. EMI gaskets 120 are also generally used to maintain shielding effectiveness by proper seam management. The shielding effectiveness of a seam is generally dependent upon the materials used, along with the contact pressure, and the surface area. The objective of the EMI gaskets 120 is to construct a wall or shield across the opening of the modules 130.

Figure 2:
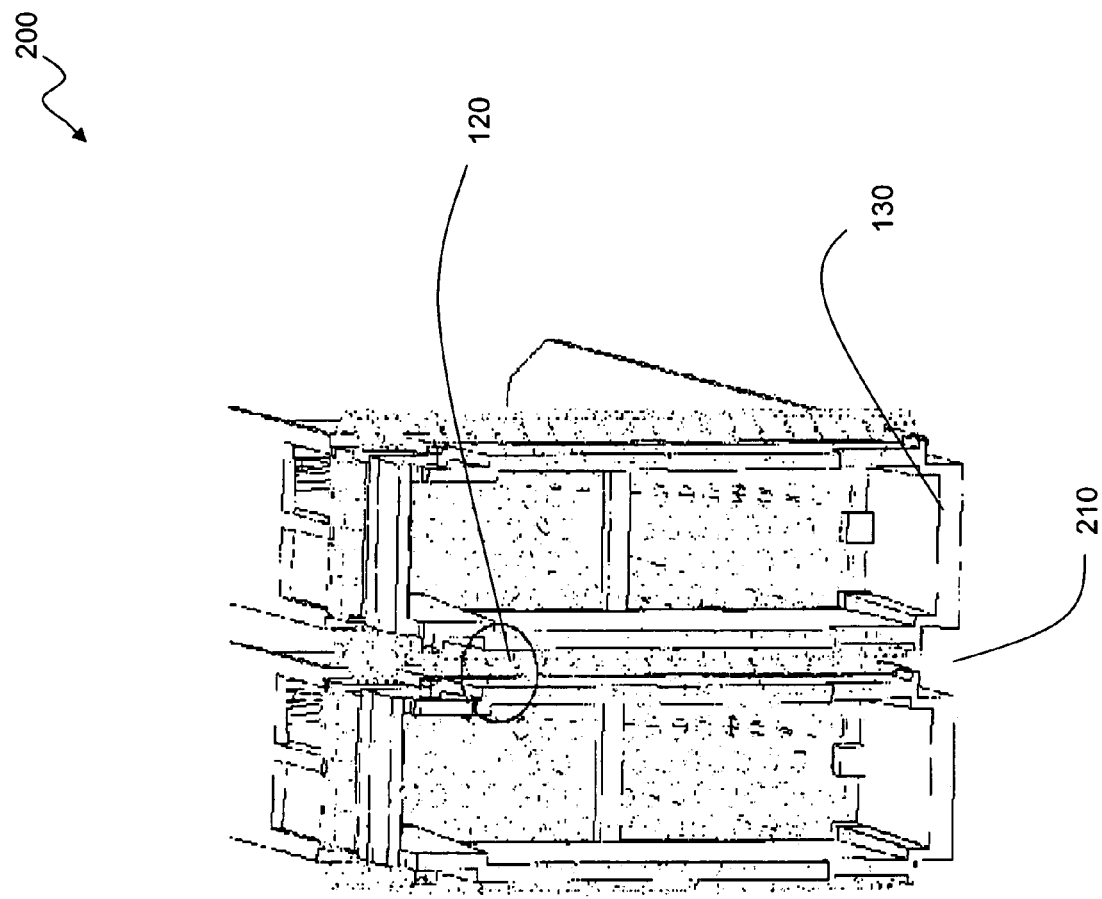
FIG. 2 illustrates a perspective view of two modules pressed together for continuity of EMI grounding, in accordance with a preferred embodiment.

Referring to FIG. 2, a perspective view of two modules 200 pressed together for continuity of EMI grounding is illustrated, in accordance with a preferred embodiment. Note that in FIGS. 1-8, identical or similar parts or elements are generally indicated by identical reference numerals. As indicated in FIG. 2, the gap 210 located and formed between the two modules 130 can be filled with an EMI gasket 120. The adjacent modules can be configured to possess similar features contacting one another to the crown. These features can overlap with an interference, thereby resulting in sufficient pressure to maintain a good EMI grounding.

Figure 3:
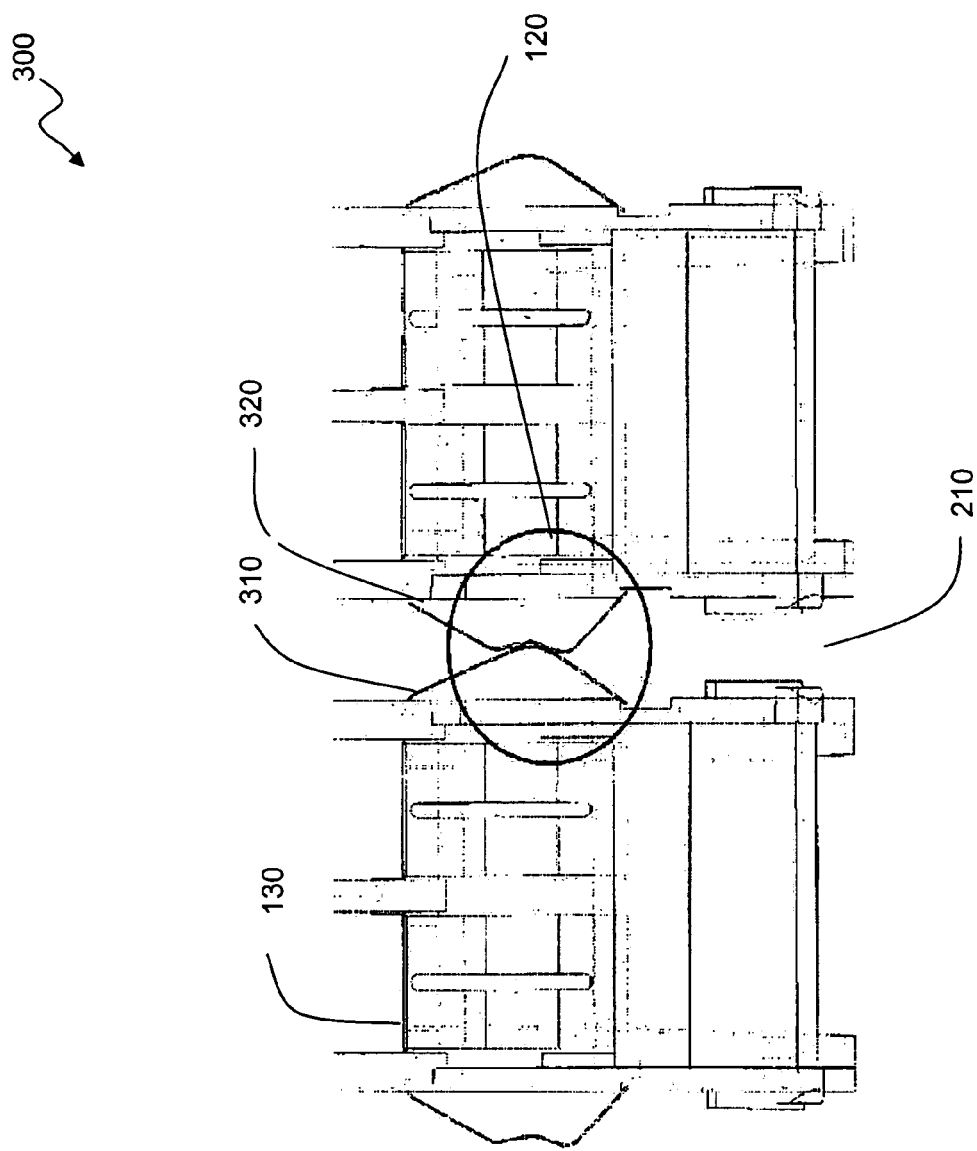
FIG. 3 illustrates a perspective view of crown and valley of an EMI gasket with opposite features nesting together between two modules, in accordance with a preferred embodiment.

Referring to FIG. 3, a perspective view of a crown and a valley of an EMI gasket 300 with opposite features nesting together between two modules is illustrated, in accordance with a preferred embodiment. Again, as indicated earlier, identical parts of elements depicted in FIGS. 1-8 are generally indicated by identical reference numerals. As indicated in FIG. 3, the crown 310 and the valley 320 of an EMI gasket 120 are generally nested together. The perpendicular pressure forces the EMI gaskets 120 to center and align evenly, thereby resulting in a good EMI grounding and reducing electromagnetic leakage. Additionally, the exterior or cosmetic appearance of modules 130 are aligned evenly. This would involve combining modules 130 by eliminating or redesigning perimeter framing around modules 130. Fit can be improved by impacting visual appearance and energy efficiency. The firmness of the material can also be selected to provide a superior seal and fine finished look.

The gaskets 310 and 320 form a double line of EMI ground contacts which creates a double EMI shield. An added barrier to EMI interference can be achieved by utilizing a double-shielded construction. The double sided EMI shield can be used for maximum heat transfer. Double shielding of cables further prevents unwanted electromagnetic energy from entering the modules 130. For enhanced shielding effectiveness, the shield can be metalized on both sides to create a double shield that can provide excellent thermal, mechanical, environmental and chemical properties.

Figure 4:
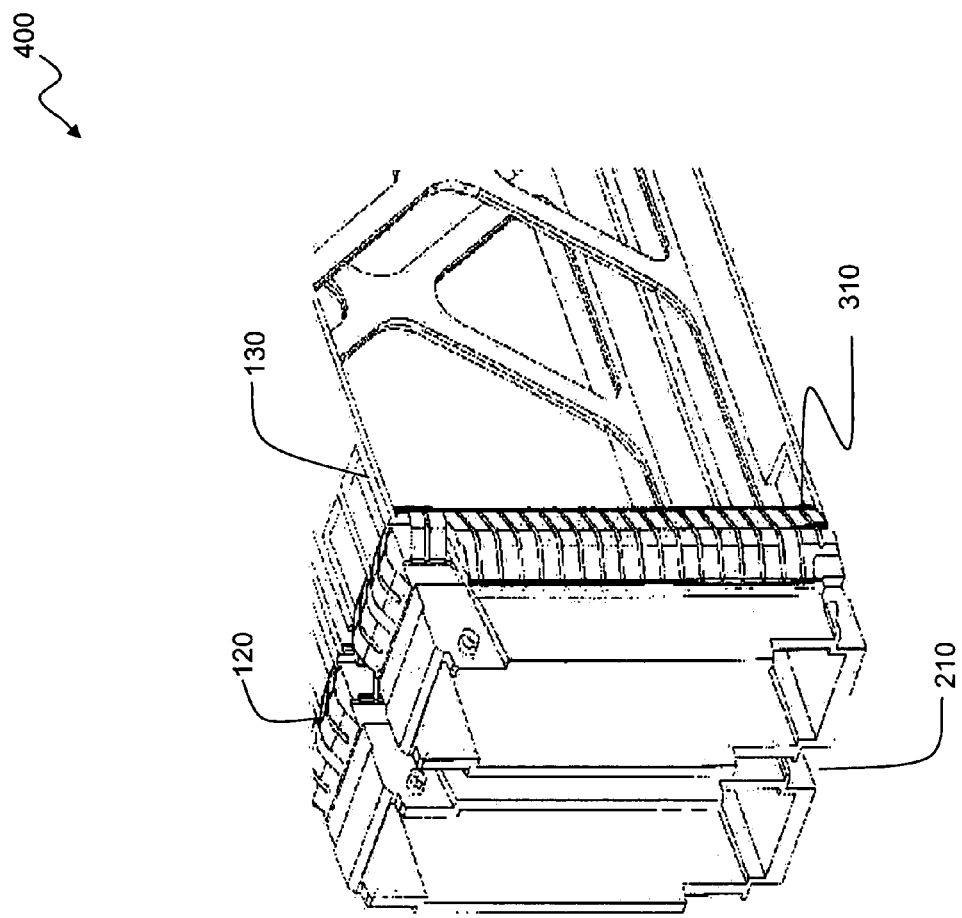
FIG. 4 illustrates a side view of a module showing the crown feature of an EMI gasket, in accordance with an preferred embodiment.

Referring to FIG. 4, a side view of a module 400 and the crown feature of an EMI gasket are illustrated, in accordance with a preferred embodiment. The gap 210 between the modules 130 is generally shielded with EMI gaskets 120. Also, as depicted in FIG. 4, the crown 310 is depicted on one side of the module 130.

Figure 5:
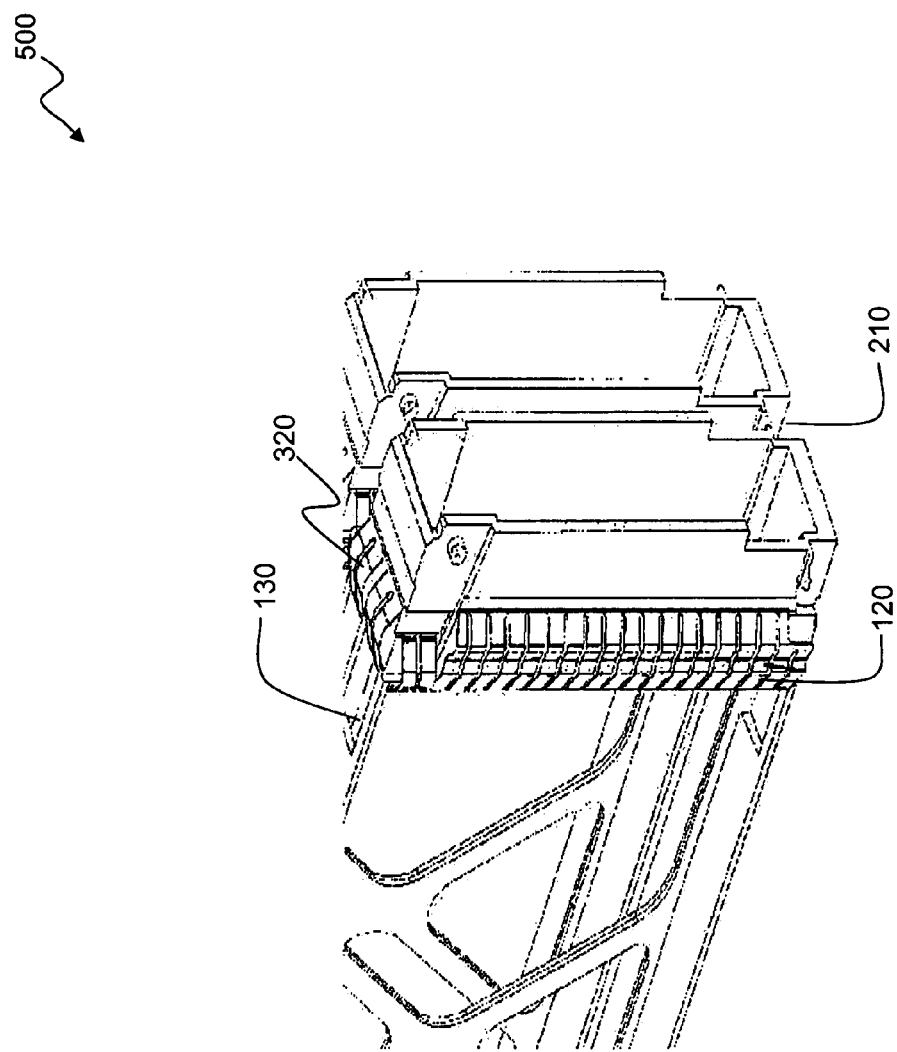
FIG. 5 illustrates a side view depicting a valley feature of an EMI gasket on an opposite side of the module, in accordance with an preferred embodiment.

Referring to FIG. 5, a side view showing the valley feature of an EMI gasket 500 on the opposite side of the module is illustrated, in accordance with a preferred embodiment. As indicated in FIG. 5, the gap 210 located and formed between the modules 130 is shielded with one or more EMI gaskets 120 such that the valley 320 complements the crown 310, which is located on the other side of the module 130.

Figure 6:
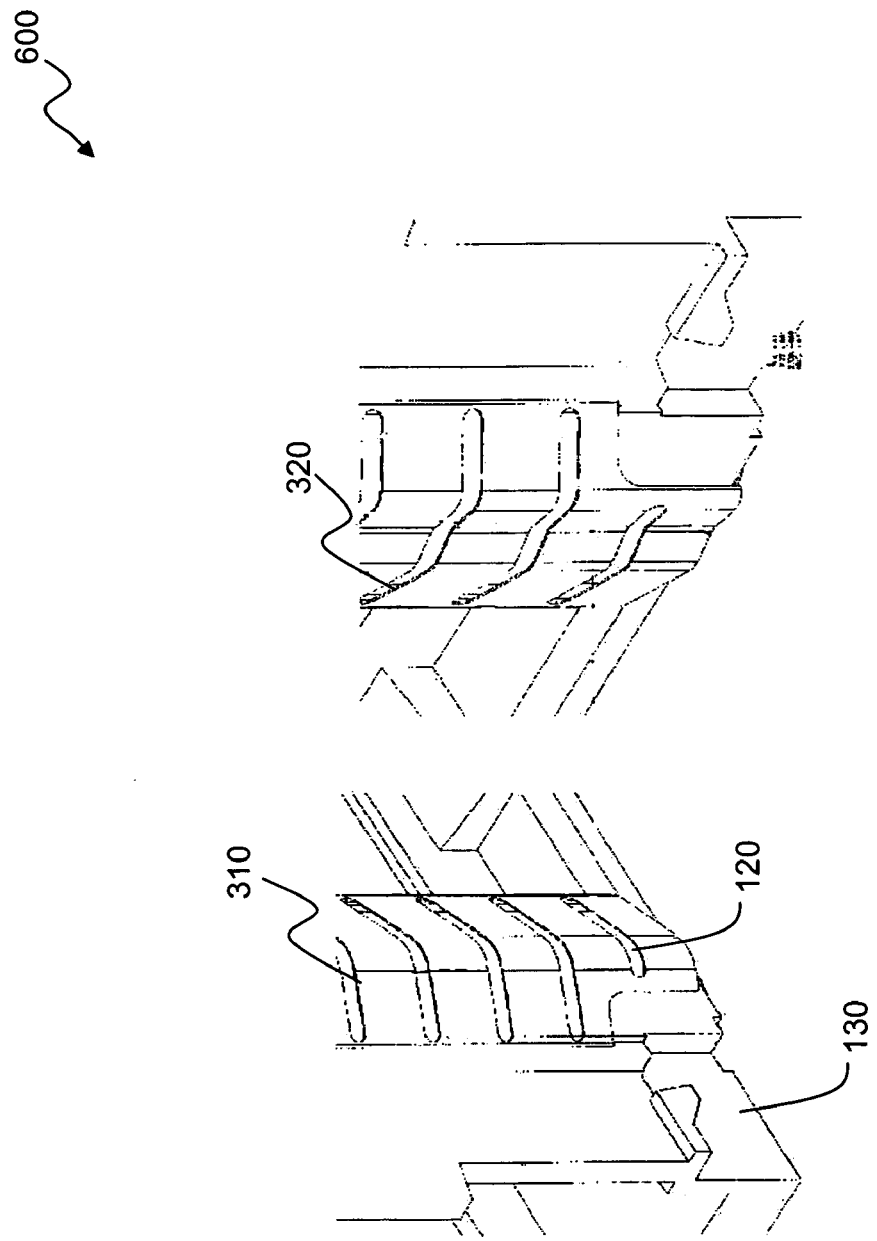
FIG. 6 illustrates an exploded perspective view of two modules assembled with an EMI gasket, in accordance with a preferred embodiment.

Referring to FIG. 6, an exploded perspective view 600 of two modules assembled with an EMI gasket is illustrated, in accordance with a preferred embodiment. The view 600 shown in FIG. 6 clearly shows the crown 310 and the valley 320 on opposite sides of module(s) 130. The EMI gaskets 120 with the features of crown 310 and valley 320 provide a low-impedance ground so that the metal structural parts that form the chassis will not be affected by internal electromagnetic fields and therefore will not contribute to the radiated electromagnetic fields within an enclosure.

Figure 7:
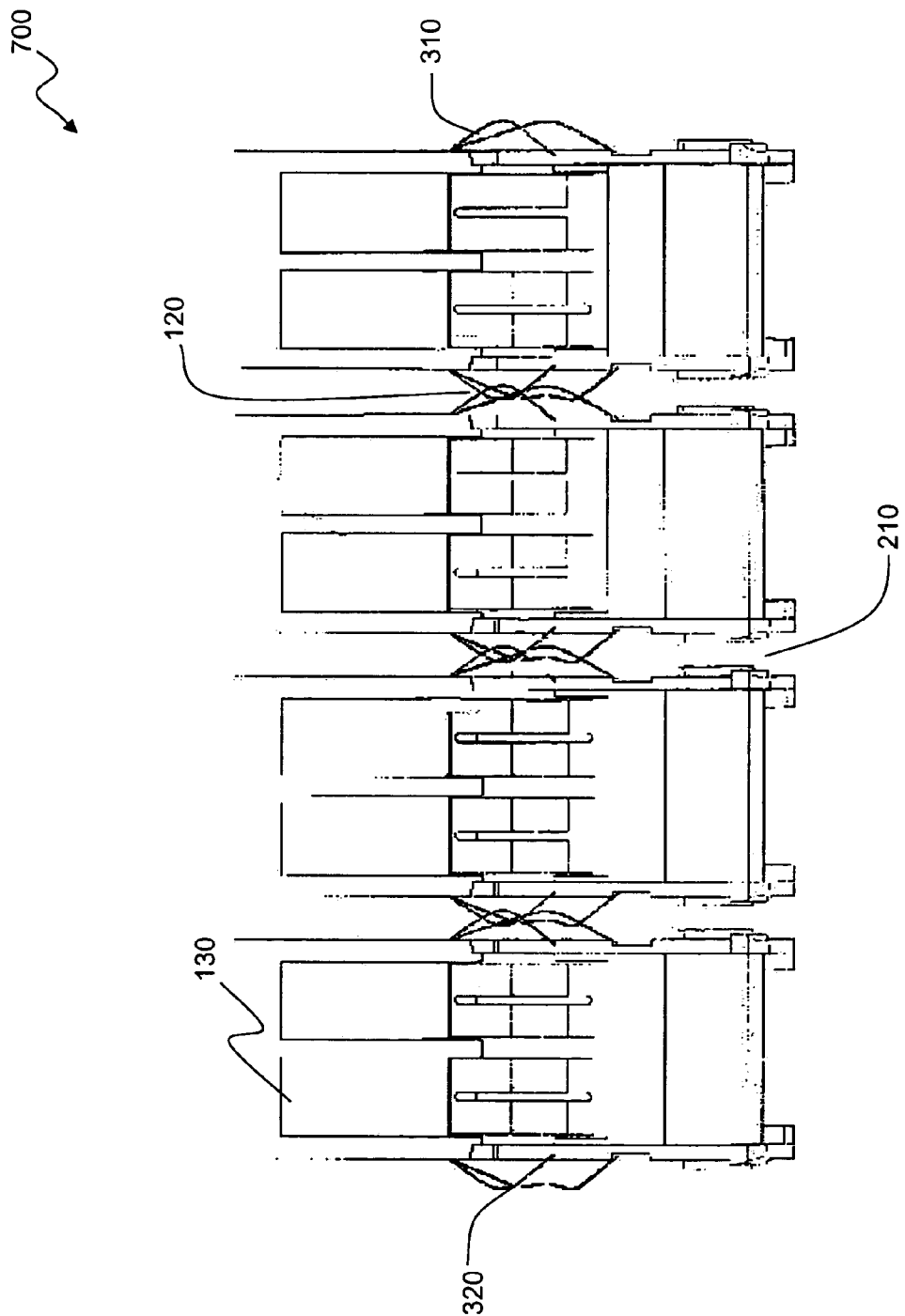
FIG. 7 illustrates a top perspective view of multiple modules shielded with EMI gaskets with overlapping of crown and valley feature, in accordance with a preferred embodiment.

Referring to FIG. 7, a top perspective view of multiple modules shielded with EMI gaskets 700 and an overlapping of crown and valley features is illustrated, in accordance with a preferred embodiment. Again, as indicated earlier, identical parts or elements depicted in FIGS. 1-8 are generally indicated by identical reference numerals. As the modules 130 are assembled side by side, the overlap of crown 310 and valley 320 of EMI gasket 120 that is placed between the gaps 210 produces a perpendicular pressure that forces the EMI gasket 120 to center and align evenly in order to create a pressure for sufficient EMI grounding.

Figure 8:
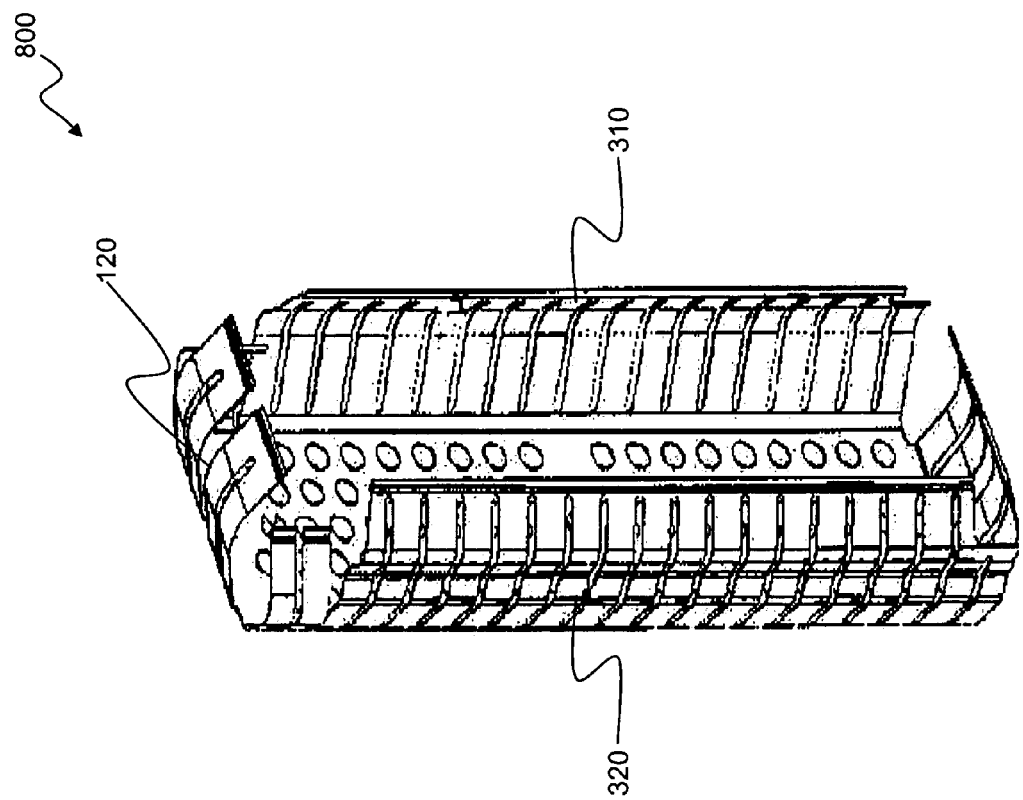
FIG. 8 illustrates a perspective view of an EMI gasket with a crown feature on one side and a valley feature that complements the crown on the opposite side, in accordance with a preferred embodiment.

Referring to FIG. 8, a perspective view of an EMI gasket 800 with a crown feature on one side and a valley feature that complements the crown on the opposite side is illustrated, in accordance with a preferred embodiment. The EMI gasket 120 generally includes a crown 310 located on one side and a valley 320 on the other side. The EMI gasket 120 is configured to preferably conform to the irregularities of the two mating surfaces under the applied force. The contact pressure should be great enough for the EMI gasket 120 to make an adequate metal-to-metal contact, even in the presence of a non-conducting film on the mating surfaces.

Figure 9:
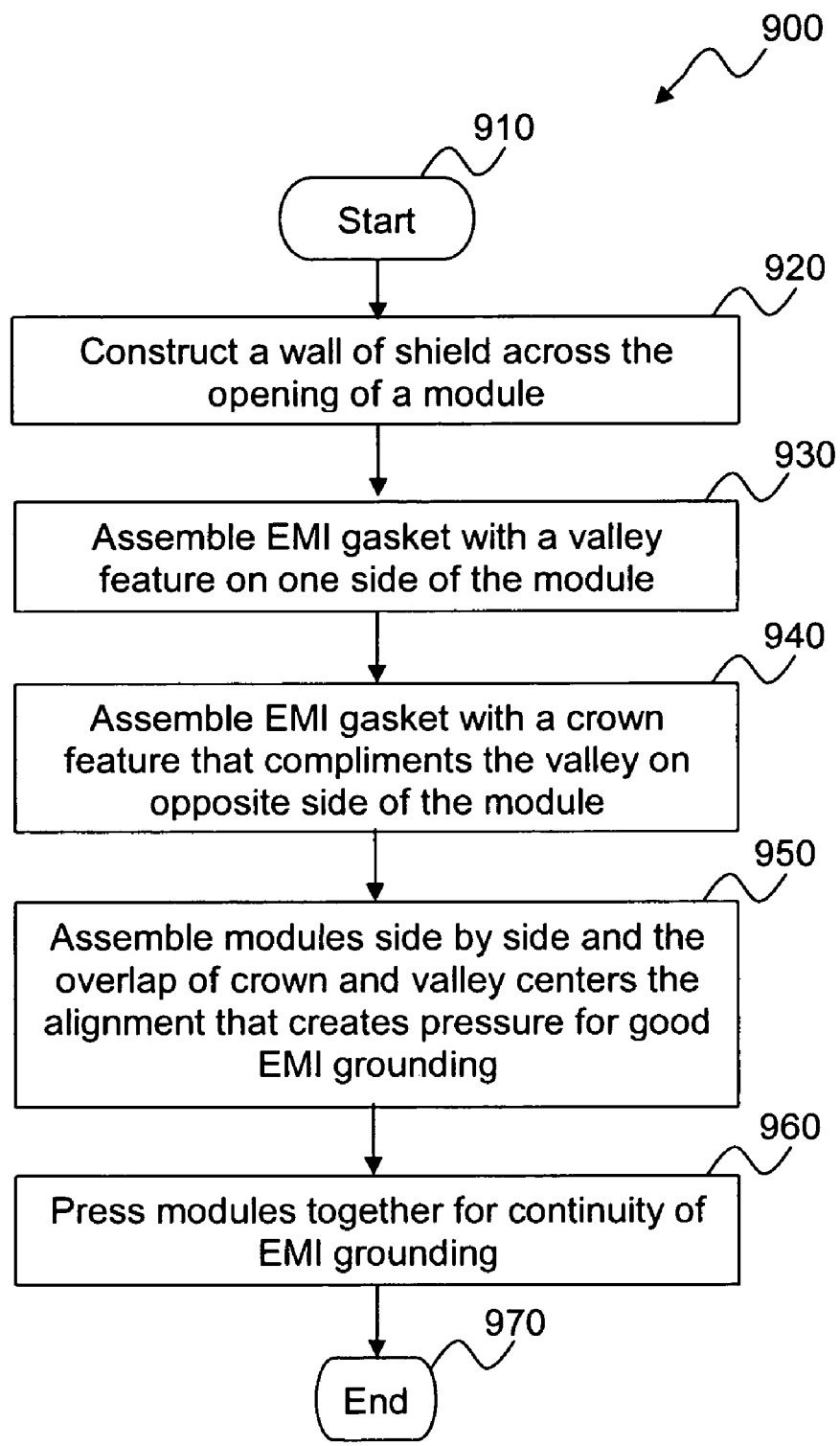
FIG. 9 illustrates a high level flow chart of operations depicting logical operation steps for self aligning EMI gaskets for customer removable modules, in accordance with an alternative embodiment.

Referring to FIG. 9, a high level flow chart 900 or operations is illustrated, depicting logical operation steps for implementing self-aligning EMI gaskets for customer removable modules, in accordance with an alternative embodiment. The process depicted in FIG. 9 can be initiated, as indicated at block 910. Thereafter, as depicted at block 920, a wall or shield across the opening of the module can be constructed. An EMI gasket with a valley feature on one side of the module can then be assembled, as shown in block 930. Next, as depicted at block 940, an EMI gasket can be assembled on the opposite side of the module with a crown feature that complements the valley. Thereafter, as indicated at block 950, the modules can be assembled side by side and the overlapping of the crown and the valley results in centering the alignment to creates pressure for enhanced EMI grounding. Similarly, the modules can be pressed together for continuity of EMI grounding, as depicted in block 960. The process can then terminate, as indicated at block 970.

Based on the foregoing it can be appreciated that an EMI gasket can be used to shield multiple modules within a housing or a cage in order to prevent electromagnetic interference from customer removable modules. The EMI gasket described herein addresses many of the problems inherent with traditional EMI shields or gaskets. One of the primary advantages of the EMI gasket configuration described herein is that proper alignment or seaming of gaskets between the modules centers the alignment and creates a good EMI grounding and eliminates EMI leakage. The joints or seams can be made continuous between the metal contacts by using a valley and crown that complements each other in their feature on opposite sides of the EMI gasket which eliminates external features such as levers and latches. EMI gaskets are preferred in order to reduce the number of fasteners and compensate for mechanical variations or joint unevenness.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A method for facilitating electromagnetic energy shielding, comprising:
placing an electromagnetic interference (EMI) gasket across an opening formed among a plurality of modules within a housing in order to construct an EMI shield;
positioning said EMI gasket in association with a valley located on one side of said plurality of modules and in association with a crown located on another side of said plurality of modules in order to complement said valley; and
thereafter pressing each module among said plurality of modules together in order to provide for a continuity of an EMI grounding and thereby facilitate electromagnetic energy shielding via said EMI shield.

2. The method of claim 1 further comprising:
assembling said plurality of modules such that each module among said plurality of modules is located side-by-side; and
overlapping said crown with said valley to promote an alignment among said plurality of modules.

3. The method of claim 1 further comprising configuring said EMI gasket as a link in said plurality of modules in order to complete a seal across said opening in said housing.

4. The method of claim 1 further comprising:
generating a perpendicular pressure in order to force said EMI gasket to center and align evenly; and
overlapping with an interference to generate a pressure for maintaining said EMI grounding.

5. The method of claim 1 further comprising forming a double line of EMI ground contacts in order to create a double EMI shield.

6. The method of claim 5 wherein said double EMI shield prevents unwanted electromagnetic energy from entering said plurality of modules.

7. The method of claim 1 further comprising centering and aligning evenly said plurality of modules in order to improve a cosmetic appearance thereof.

8. A method for facilitating electromagnetic energy shielding, comprising:
placing an electromagnetic interference (EMI) gasket across an opening formed among a plurality of modules within a housing in order to construct an EMI shield;
positioning said EMI gasket in association with a valley located on one side of said plurality of modules and in association with a crown located on another side of said plurality of modules in order to complement said valley;
assembling said plurality of modules such that each module among said plurality of modules is located side-by-side; and
overlapping said crown with said valley to promote an alignment among said plurality of modules.
thereafter pressing each module among said plurality of modules together in order to provide for a continuity of an EMI grounding and thereby facilitate electromagnetic energy shielding via said EMI shield.

9. The method of claim 8 further comprising configuring said EMI gasket as a link in said plurality of modules in order to complete a seal across said opening in said housing.

10. The method of claim 9 further comprising:
generating a perpendicular pressure in order to force said EMI gasket to center and align evenly; and
overlapping with an interference to generate a pressure for maintaining said EMI grounding.

11. The method of claim 9 further comprising forming a double line of EMI ground contacts in order to create a double EMI shield.

12. The method of claim 11 wherein said double EMI shield prevents unwanted electromagnetic energy from entering said plurality of modules.

13. The method of claim 9 further comprising centering and aligning evenly said plurality of modules in order to improve a cosmetic appearance thereof.

14. An apparatus for facilitating electromagnetic energy shielding, comprising:
   an electromagnetic interference (EMI) gasket placed across an opening formed among a plurality of modules within a housing in order to construct an EMI shield;
   a valley located on one side of said plurality of modules and a crown located on another side of said plurality of modules, wherein said EMI gasket is positioned in association with said valley and said crown in order to complement said valley, wherein each module among said plurality of modules is pressed together in order to provide for a continuity of an EMI grounding and thereby facilitate electromagnetic energy shielding via said EMI shield.

15. The apparatus of claim 14 wherein:
   said plurality of modules are assembled such that each module among said plurality of modules is located side-by-side; and
   said crown is overlapped with said valley to promote an alignment among said plurality of modules.

16. The apparatus of claim 14 wherein said EMI gasket comprises a link in said plurality of modules in order to complete a seal across said opening in said housing.

17. The apparatus of claim 14 further comprising:
   a generated perpendicular pressure that forces said EMI gasket to center and align evenly; and
   an interference overlapped to generate a pressure for maintaining said EMI grounding.

18. The apparatus of claim 14 further comprising a double line of EMI ground contacts formed in order to create a double EMI shield.

19. The apparatus of claim 18 wherein said double EMI shield prevents unwanted electromagnetic energy from entering said plurality of modules.

20. The method of claim 14 wherein said plurality of modules is centered and aligned evenly in order to improve a cosmetic appearance thereof.

* * * * *